(12) United States Patent
Kim (10) Patent No.: US 9,275,754 B2
(45) Date of Patent: Mar. 1, 2016

(54) SHIFT REGISTER, DATA DRIVER HAVING THE SAME, AND LIQUID CRYSTAL DISPLAY DEVICE

(75) Inventor: Sun Young Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1490 days.

(21) Appl. No.: 11/889,045

(22) Filed: Aug. 8, 2007

(65) Prior Publication Data
US 2008/0062113 A1 Mar. 13, 2008

(30) Foreign Application Priority Data

Sep. 7, 2006 (KR) .................. 10-2006-0086046

(51) Int. Cl.
*G09G 3/36* (2006.01)
*G11C 19/00* (2006.01)
*G11C 19/28* (2006.01)

(52) U.S. Cl.
CPC .............. *G11C 19/00* (2013.01); *G09G 3/3688* (2013.01); *G11C 19/28* (2013.01); *G09G 2310/027* (2013.01)

(58) Field of Classification Search
CPC .............. G09G 3/3677; G09G 3/3688; G09G 2310/0264; G09G 2310/0286; G09G 2310/0294
USPC .................................. 345/87–104; 377/64–81
See application file for complete search history.

(56) References Cited

U.S. PATENT DOCUMENTS

| | | | | |
|---|---|---|---|---|
| 4,495,629 A | * | 1/1985 | Zasio et al. ................. | 345/100 |
| 5,689,517 A | * | 11/1997 | Ruparel .................. | 714/731 |
| 6,023,260 A | | 2/2000 | Higashi | |
| 6,067,066 A | * | 5/2000 | Kubota et al. ................. | 345/98 |
| 6,498,596 B1 | * | 12/2002 | Nakamura et al. ............ | 345/98 |
| 6,628,258 B1 | * | 9/2003 | Nakamura .................... | 345/98 |
| 7,006,067 B2 | * | 2/2006 | Tobita et al. .................. | 345/92 |
| 7,196,699 B1 | * | 3/2007 | Kubota et al. ................ | 345/211 |
| 7,221,339 B2 | * | 5/2007 | Ozawa et al. ................. | 345/76 |
| 7,414,602 B2 | * | 8/2008 | Kobashi ....................... | 345/87 |
| 7,623,098 B2 | * | 11/2009 | Yamazaki et al. ............. | 345/77 |
| 7,633,471 B2 | * | 12/2009 | Yamazaki et al. ............. | 345/83 |
| 7,636,078 B2 | * | 12/2009 | Yamazaki et al. ............ | 345/100 |
| 2002/0011983 A1 | * | 1/2002 | Yamazaki et al. ............. | 345/92 |
| 2002/0154151 A1 | * | 10/2002 | Koyama ..................... | 345/690 |
| 2002/0158829 A1 | * | 10/2002 | Yamazaki et al. ............ | 345/92 |
| 2003/0234761 A1 | * | 12/2003 | Washio et al. ............... | 345/100 |

(Continued)

FOREIGN PATENT DOCUMENTS

| | | |
|---|---|---|
| JP | 10-161592 A | 6/1998 |
| KR | 100236687 B1 | 1/2000 |

OTHER PUBLICATIONS

Korean Office Action in corresponding Korean Patent Application No. 10-2006-0086046, dated Dec. 15, 2012.

*Primary Examiner* — Alexander Eisen
*Assistant Examiner* — Nelson Lam
(74) *Attorney, Agent, or Firm* — Morgan, Lewis & Bockius LLP (57) ABSTRACT

Disclosed are a shift register capable of reducing power consumption, a data driver having the same, and a liquid crystal display device. The shift register includes a storing cell array including storage cells which store a plurality of serial data, and a control array for outputting sampling signals, which are sequentially shifted every period of data transmission such that the storage cells sequentially store the data, in response to at least one clock signal having a frequency lower than a transmission frequency of the data.

10 Claims, 6 Drawing Sheets

(56) References Cited

U.S. PATENT DOCUMENTS

| | | |
|---|---|---|
| 2004/0041765 A1* | 3/2004 | Koyama et al. ............... 345/87 |
| 2004/0130542 A1* | 7/2004 | Tanada ........................ 345/204 |
| 2004/0196240 A1* | 10/2004 | Koyama et al. ............... 345/92 |
| 2004/0222955 A1* | 11/2004 | Koyama ........................ 345/87 |
| 2004/0252084 A1* | 12/2004 | Miyagawa et al. ........... 345/76 |
| 2004/0257356 A1* | 12/2004 | Koyama ........................ 345/204 |
| 2005/0168428 A1* | 8/2005 | Nakajima ........... G09G 3/2011 345/99 |
| 2005/0184932 A1* | 8/2005 | Ishikawa ............. G09G 3/22 345/75.1 |
| 2005/0206607 A1* | 9/2005 | Koyama et al. ............... 345/100 |
| 2005/0206969 A1* | 9/2005 | Murade ........................ 358/474 |
| 2006/0152459 A1* | 7/2006 | Shin ............................ 345/94 |
| 2007/0001990 A1* | 1/2007 | Lee et al. ..................... 345/100 |
| 2007/0040822 A1* | 2/2007 | Koyama et al. ............... 345/204 |
| 2007/0103421 A1* | 5/2007 | Sekine et al. ................ 345/100 |
| 2007/0132673 A1* | 6/2007 | Jinno et al. .................. 345/76 |
| 2007/0188431 A1* | 8/2007 | Sato et al. .................... 345/90 |
| 2007/0273636 A1* | 11/2007 | Jan et al. ..................... 345/100 |
| 2009/0273593 A1* | 11/2009 | Tonogai ............. G09G 3/3688 345/214 |
| 2009/0315868 A1* | 12/2009 | Yokoyama et al. ........... 345/204 |

* cited by examiner

SHIFT REGISTER, DATA DRIVER HAVING THE SAME, AND LIQUID CRYSTAL DISPLAY DEVICE

The present application claims priority under 35 U.S.C. 119 and 35 U.S.C. 365 to Korean Patent Application No. 10-2006-0086046 (filed on Sep. 7, 2006), which is hereby incorporated by reference in its entirety.

BACKGROUND OF THE INVENTION

1. Field of the Invention

The present invention relates to a shift register, and more particularly to a shift register capable of reducing power consumption through low frequency driving, a data driver having the same, and a liquid crystal display device.

2. Description of the Related Art

Shift registers are widely used for various flat panel display devices as well as data processing devices to sequentially process data. The flat panel display devices may process data at a high data rate according to data processing capability of the shift register.

For example, the flat panel display devices include liquid crystal display devices (LCDs), plasma display panels (PDPs), and electro luminescent displays (ELDs).

The LCDs display images by using optical anisotropy and polarization characteristics of liquid crystal. Since the liquid crystal has an elongated structure, liquid crystal molecules are aligned with directionality. The alignment direction of the liquid crystal molecules can be variously controlled by applying an electric field to the liquid crystal.

The LCDs sequentially process data provided from a graphic card by using the shift register to display images on a liquid crystal panel.

The shift register provided in the liquid crystal display devices operates as follows. The LCD mainly includes a liquid crystal panel for displaying images and a driver for driving the liquid crystal panel.

In detail, the liquid crystal panel includes a first substrate provided with thin film transistors (TFTs), a second substrate provided with a color filter and facing the first substrate, and a liquid crystal layer interposed between the first and second substrates. A plurality of gate lines and a plurality of data lines are arranged on the first substrate, and the TFTs are provided in cross sections between the gate lines and data lines.

The driver for driving the liquid crystal panel includes a gate driver for driving gate lines aligned on the liquid crystal panel, a data driver for driving the data lines, and a timing controller for controlling the gate driver and the data driver.

The gate driver provides gate scan signals to the gate lines according to a gate control signal generated from the timing controller, and the data driver provides data to the data lines according to a data control signal generated from the timing controller.

In detail, the data driver applies data voltage to the data lines according to the data control signal generated from the timing controller such that various gray scales can be expressed on the liquid crystal panel.

The data driver includes a shift register, a latch unit, and a digital-analog converter. Especially, the shift register is enabled by a clock signal having a high frequency to output sampling signals.

In order to process data at a high data rate without being influenced by noise, the shift register is driven at a high frequency so that data are provided to the data lines.

Since the data driver, exactly, the shift register is driven at a high frequency, power consumption may increase. In addition, since additional circuits must be provided in order to drive the data driver at a high frequency, a circuit part for driving the data driver may have a large size.

SUMMARY OF THE INVENTION

Accordingly, the present invention is directed to a liquid crystal display device that substantially obviates one or more of the problems due to limitations and disadvantages of the related art.

An object of the present invention is to provide a shift register operating at a low frequency, a data driver having the same, and a liquid crystal display device.

In addition, another object of the present invention is to provide a shift register capable of reducing power consumption, a data driver having the same, and a liquid crystal display device.

In order to accomplish the objects, there is provided a shift register including a storing cell array including storage cells which store a plurality of serial data, and a control array for outputting sampling signals, which are sequentially shifted every period of data transmission such that the storage cells sequentially store the data, in response to at least one clock signal having a frequency lower than a transmission frequency of the data.

In order to accomplish the objects, there is provided a data driver comprising a shift register including a storing cell array, which has storage cells storing a plurality of data serially arranged, and a control array, which outputs sampling signals sequentially shifted every period of data transmission such that the storage cells sequentially store the data, in response to at least one clock signal having a frequency lower than a transmission frequency of the data, a latch array for simultaneously latching data, which are received from an exterior, by a last sampling signal of the sampling signals output from the control array, a digital-analog converter for converting the data latched in the latch array into analog voltage, and a buffer unit for outputting the analog voltage converted in the digital-analog converter.

In order to accomplish the objects, there is provided a liquid crystal display device comprising a data driver including a shift register, which includes a storing cell array having storage cells storing a plurality of data serially arranged and a control array outputting sampling signals sequentially shifted every period of data transmission such that the storage cells sequentially store the data, in response to at least one clock signal having a frequency lower than a transmission frequency of the data, a latch array, which simultaneously latches data received from an exterior by a last sampling signal of the sampling signals output from the control array, a digital-analog converter, which converts the data latched in the latch array into analog voltage, and a buffer unit, which outputs the analog voltage converted in the digital-analog converter, and a liquid crystal panel for displaying an image corresponding to the data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory, and are intended to provide further explanation of the invention as claimed.

BRIEF DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE INVENTION

Hereinafter, embodiments of the present invention will be described with reference to accompanying drawings.

Figure 1:
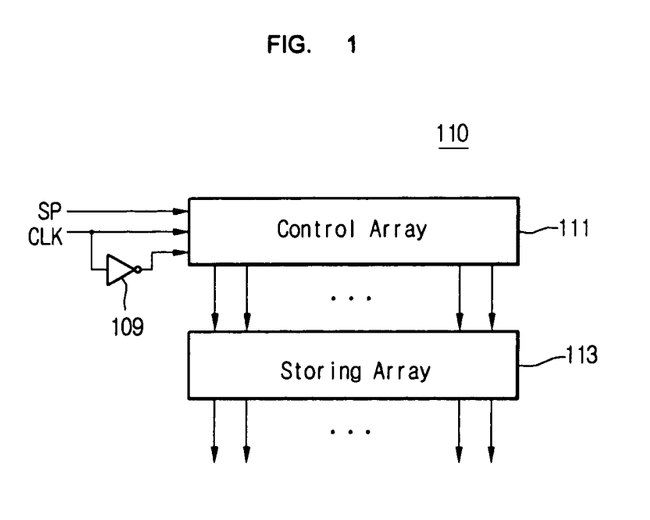
FIG. 1 is a block diagram showing a shift register according to the present invention.

FIG. 1 is a block diagram showing a shift register 110 according to the present invention.

As shown in FIG. 1, the shift register 110 includes a control array 111, which sequentially shifts a start pulse signal SP in response to at least one clock signal CLK applied from an exterior to output sampling signals, and a storing array 113, which stores data supplied to an exterior in response to the sampling signals output from the control array 111.

The shift register 110 further includes an inverter 109, which receives at least one clock signal CLK to output a clock signal obtained by inverting the clock signal CLK.

The clock signal CLK and the inverted clock signal output from the inverter 109 are applied to the control array 111. In addition, the start pulse signal SP is applied to the control array 111 from an exterior.

The control array 111 performs a sampling operation for the start pulse signal SP to generate a storing control signal used to control the storing array 113.

Figure 2:
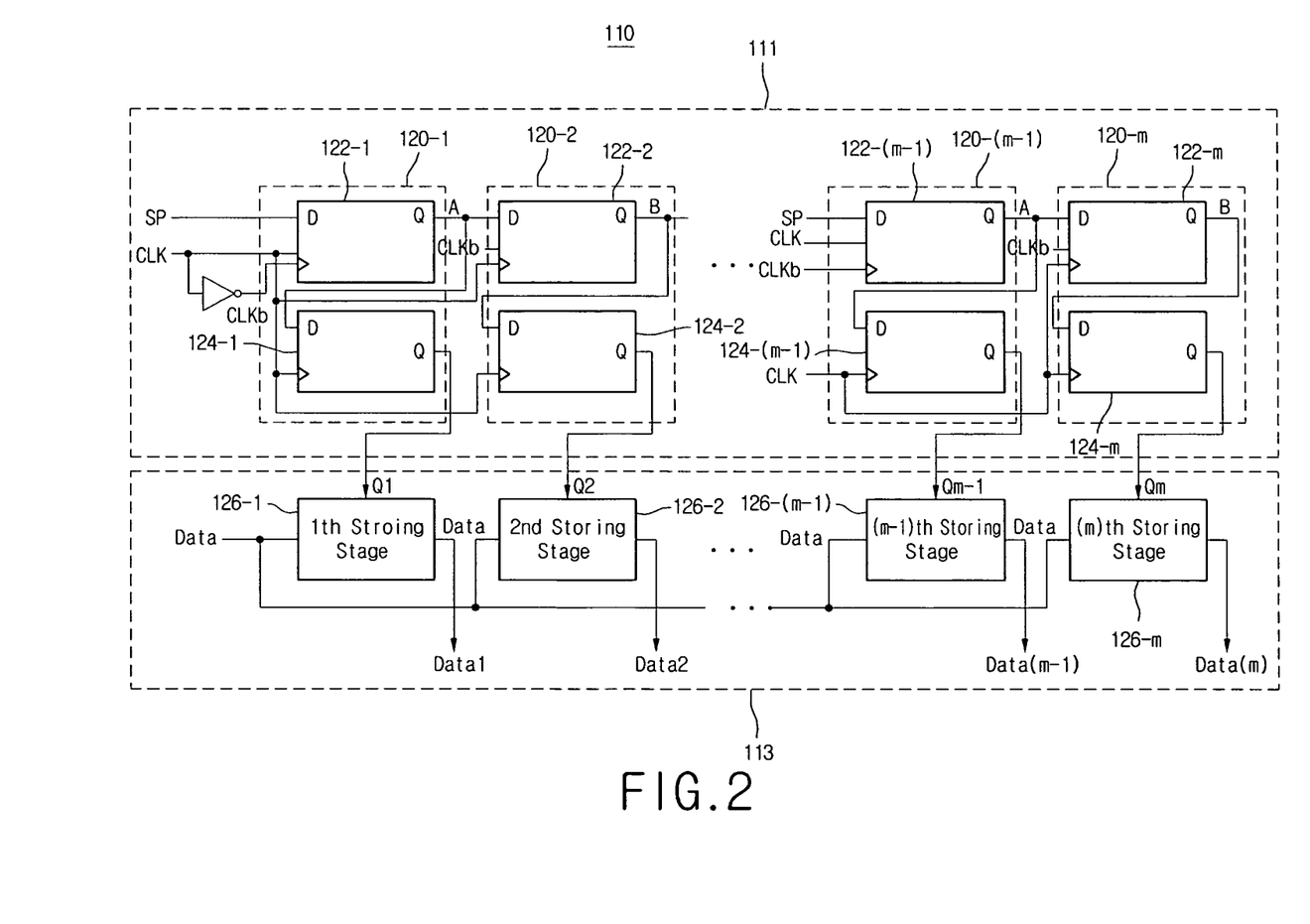
FIG. 2 is a detailed logic circuit diagram showing a shift register shown in FIG. 1.
Figure 3:
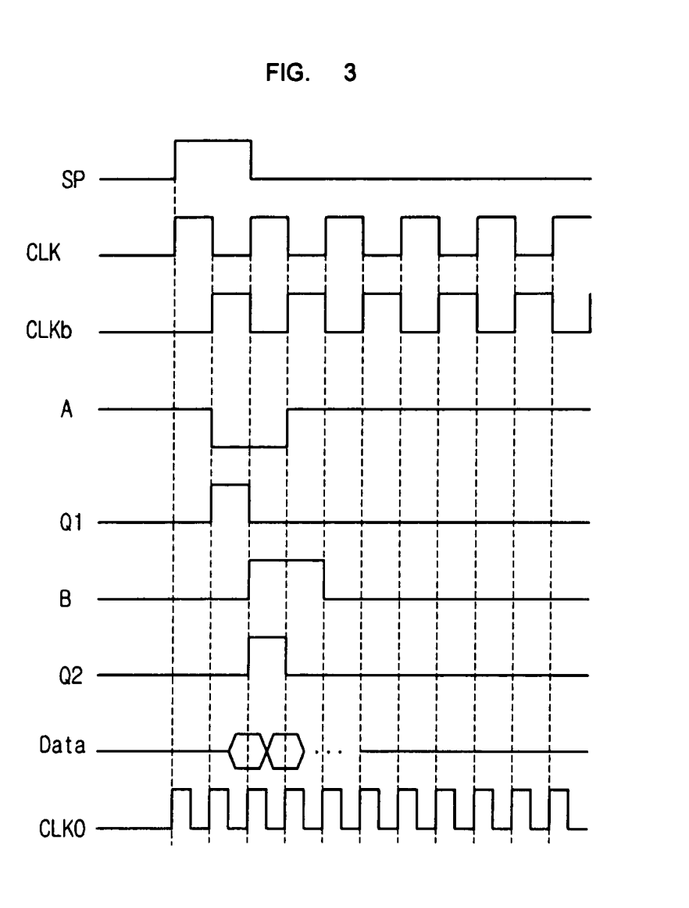
FIG. 3 is a timing chart of signals output from a shift register shown in FIG. 2.

FIG. 2 is a logic circuit diagram showing the shift register 110 of FIG. 1 in detail, and FIG. 3 is a timing chart showing signals output from the shift register 110 of FIG. 2.

As shown in FIGS. 2 and 3, the shift register 110 includes a plurality of control stages 120-1 to 120-$m$ and a plurality of storing stages 126-1 to 126-$m$ corresponding to the control stages 120-1 to 120-$m$ as described above.

The control stages 120-1 to 120-$m$ include the latch units 122-1 to 122-$m$ and sampling units 124-1 to 124-$m$. The storing stages 126-1 to 126-$m$ previously store data supplied from an exterior. Then, upon receiving storing control signals from the control stages 120-1 to 120-$m$, the storing stages 126-1 to 126-$m$ output data previously stored.

The control stages 120-1 to 120-$m$ are classified into the odd control stages 120-1 to 120-($m$−1) and the even stages 120-2 to 120-$m$.

The odd control stages 120-1 to 120-($m$−1) include the odd latch units 122-1 to 122-($m$−1) and the odd sampling units 124-1 to 124-($m$−1).

Hereinafter, the first control stage 120-1 and the first storing stage 126-1 corresponding to the first control stage 120-1 will be representatively described in the description about the odd control stages 120-1 to 120-($m$−1). In addition, the second control stage 120-2 and the second storing stage 126-2 corresponding to the second control stage 120-2 in the description about the even-order-th control stages 120-2 and 120-$m$.

The first control stage 120-1 includes the first latch unit 122-1 and the first sampling unit 124-1 corresponding to the first latch unit 122-1.

The first latch unit 122-1 receives the start pulse signal SP from an exterior. In addition, the first latch unit 122-1 receives a complementary clock signal CLKb, which is obtained by inverting the clock signal CLK through the inverter. At this time, while the complementary clock signal CLKb is being output, the complementary clock signal CLKb is delayed by a half period with respect to the clock signal CLK.

The first latch unit 122-1 constitutes one flip-flop together with the second latch unit 122-2 included in the second control stage 120-2. In other words, the first and second latch units 122-1 and 122-2 are included in one flip-flop.

The first latch unit 122-1 latches the start pulse signal SP from an exterior so as to output a first sampling control signal A in response to the complementary clock signal CLKb output from the inverter 109. The first sampling control signal A is provided in the first sampling unit 124-1 and the second latch unit 122-2, which is a next stage of the first latch unit 122-1.

The first sampling unit 124-1 outputs a first sampling signal Q1 having a high pulse in response to the high pulse of the complementary clock signal CLKb during a low level of the first sampling control signal A received from the first latch unit 122-1.

The first sampling signal Q1 is provided to the first storing stage 126-1.

The first storage stage 126-1 previously stores first data input from an exterior. In addition, upon receiving the first sampling signal Q1 from the first sampling unit 124-1, the first storing stage 126-1 latches the first data Data1.

As described above, the first sampling control signal A is provided in the second latch unit 122-2. The second latch unit 122-2 receives the clock signal CLK and the first sampling control signal A.

The second latch unit 122-2 latches the first sampling control signal A in response to the clock signal CLK to output a second sampling control signal B. The second sampling control signal B output from the second latch unit 122-2 is provided in the second sampling unit 124-2 corresponding to the second latch unit 122-2 while being provided in a third latch unit (not shown), which is positioned at a next stage. At this time, the clock signal CLK is provided in even the second sampling unit 124-2.

The second sampling unit 124-2 outputs a second sampling signal Q2, which responds to a high pulse of the clock signal CLK, during a high level of the second sampling control signal B provided from the second latch unit 122-2. At this time, the first sampling control signal A output from the first latch unit 122-1 and the second sampling control signal B output from the second latch unit 122-2 are delayed by a half period. This is because the complementary clock signal CLKb is delayed by a half period with respect to the clock signal CLK.

The second sampling signal Q2 output from the second sampling unit 124-2 is provided to the second storing stage 126-2.

The second storing stage 126-2 previously stores second data Data2 received from an exterior. Upon receiving the second storing control signal Q2, the second storing stage 126-2 latches the second data Data2 which are previously stored.

The second sampling control signal B output from the second latch unit 122-2 is provided in the third latch unit of the next stage, so that the third latch unit performs the above operation.

Consequently, the first latch unit 122-1 lathes the start pulse signal SP to output the first sampling control signal A in response to the high pulse of the complementary clock signal CLKb generated from the inverter 109. The first sampling control signal A is provided in the first sampling unit 124-1 to output the first sampling signal Q1.

The second latch unit 122-2 latches the first sampling control signal A to output the second sampling control signal B in response to a high pulse of the clock signal CLK. The second sampling control signal B is provided in the second sampling unit 124-2 such that the second sampling signal Q2 is output.

The second sampling control signal B is delayed and output by a half period with respect to the first sampling control signal A. Since the second sampling control signal B is output after a half period lapses from the output of the first sampling control signal A, the first sampling control signal A overlaps with the second sampling control signal B for the half period.

Meanwhile, the first and second sampling signals Q1 and Q2 maintain a high level during a half period of the first and second sampling control signals A and B. In other words, the first sampling signal Q1 is output during a half period of low level of the first sampling control signal A, and the second sampling signal Q2 is output during a half period of high level of the second sampling control signal B. In detail, the second sampling signal Q2 is output for a half period in which the first sampling control signal A overlaps with the second sampling control signal B.

Accordingly, the second sampling signal Q2 is output at falling time of the first sampling signal Q1.

As described above, since the first and second latch units 122-1 and 122-2 constitute one flip-flop, the first and second sampling control signals A and B are output from one flip-flop.

Meanwhile, a conventional shift register outputs one sampling control signal from one flip-flop to transmit data in response to a existing clock signal CLK0 having a high frequency. In addition, since the conventional shift register outputs a sampling control signal and a sampling signal by using the existing clock signal CLK0 having a high frequency, the power consumption of the shift register increases.

In order to reduce power consumption, the shift register 110 according to the present invention is driven by using a clock signal CLK having a low frequency (for instance, a half of the frequency of the existing clock signal CLK0), and a complementary clock signal CLKb delayed by a half period with respect to the clock signal CLK.

The first sampling control signal A overlaps with the second sampling control signal B by the clock signal CLK and the complementary clock signal CLKb. The first and second latch units 122-1 and 122-2 constitute one flip-flop, and the first and second sampling control signals A and B are output from one flip-flop. Consequently, since two sampling control signals are output while overlapping with each other in one flip-flop, an area occupied by a circuit may be reduced.

When the first sampling control signal A is in a low level, the first control stage 120-1 outputs the high-level first sampling signal Q1 in response to a low pulse of the complementary clock signal CLK. In addition, when the second sampling control signal B is in a high level, the second control stage 120-2 outputs the high-level second sampling signal Q2 in response to a high pulse of the clock signal CLK.

The first and second sampling signals Q1 and Q2 are sequentially output. In detail, the second sampling signal Q2 is output in synchronization with the falling time of the first sampling signal Q1.

If the first sampling signal Q1 is output from the first control stage 120-1, the first sampling signal Q1 is input to the first storing stage 126-1. In this case, upon receiving the first sampling signal Q1, the first storing stage 126-1 outputs the first data Data1 previously stored. In other words, while the first sampling signal Q1 is being input to the first storing stage 126-1, the first data Data1 are output.

Then, if the second sampling signal Q2 is output from the second control stage 120-2, the second sampling signal Q2 is input to the second storing stage 126-2. In this case, upon receiving the second sampling signal Q2, the second storing stage 126-2 outputs the second data Data2 previously stored. In other words, while the second sampling signal Q2 is being input to the second storing stage 126-2, the second storing stage 126-2 outputs the second data Data2.

Consequently, the shift register 110 according to the present invention sequentially outputs data input from an exterior by using the clock signal CLK having a frequency, which is lower than that of an existing clock signal CLK0, and the complementary clock signal CLKb delayed by a half period with respect to the clock signal CLK. Accordingly, the shift register 110 is driven by using the clock signal CLK having a frequency lower than that of the existing clock signal CLK0, thereby reducing power consumption.

Figure 4A:
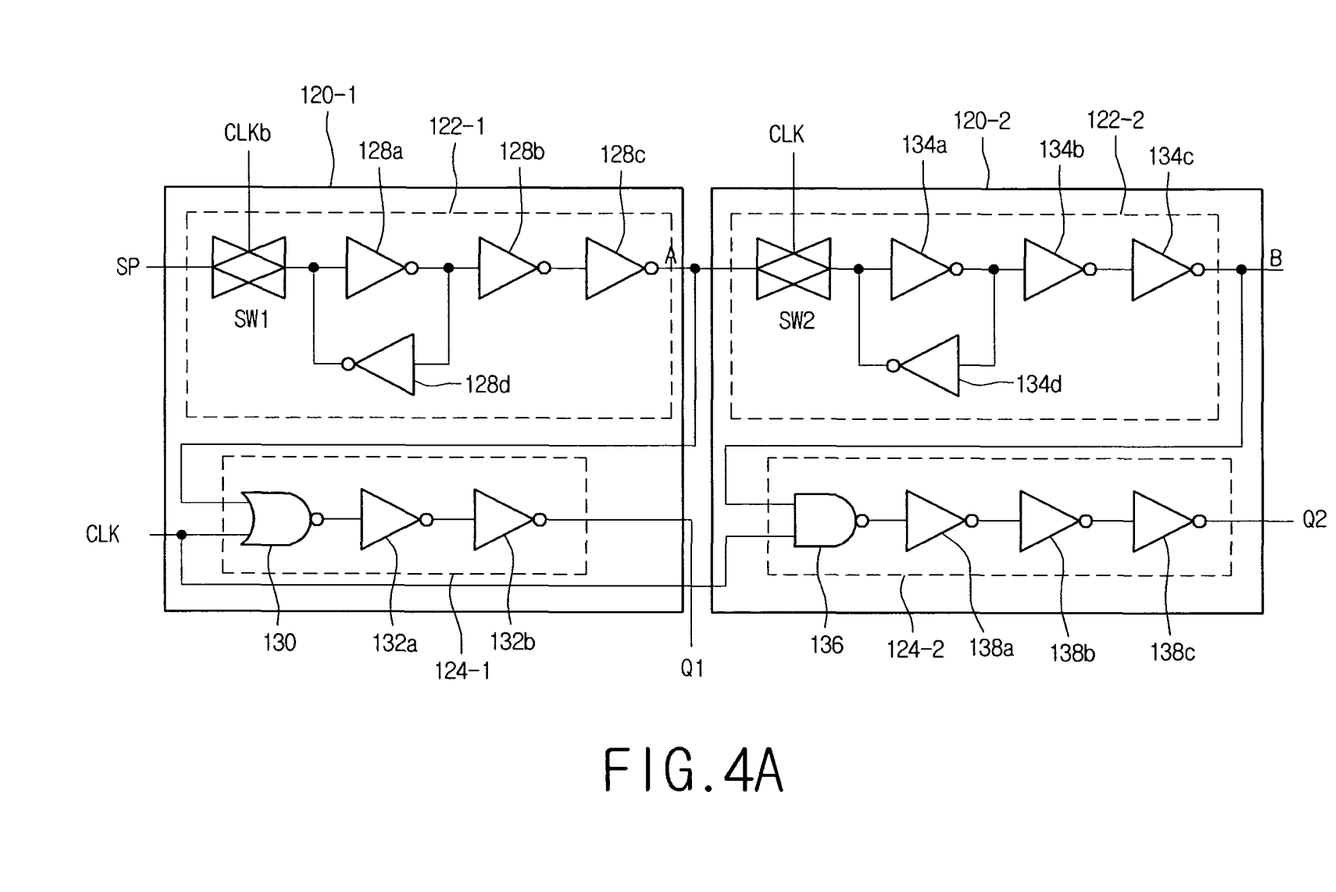
FIG. 4A is a logic circuit diagram showing first and second control stages of FIG. 2 in detail.

FIG. 4A is a logic circuit diagram showing the first and second stages of FIG. 2 in detail.

As shown in FIGS. 2 to 4A, the first control stage 120-1 includes the first latch unit 122-1 and the first sampling unit 124-1 as described above.

The first latch unit 122-1 includes a first switch SW1 and first to fourth inverters 128a to 128d. The sampling unit 124-1 includes a NOR gate 130 and the first and second inverters 132a and 132b.

The first switch SW1 of the first latch unit 122-1 receives the start pulse signal SP from an exterior. In addition, the first switch SW1 is controlled by the complementary clock signal CLKb which is an output signal of the inverter 109 shown in FIG. 2. The complementary clock signal CLKb is delayed by a half period with respect to the clock signal CLK.

If the complementary clock signal CLKb is provided in the first switch SW1, the start pulse signal SP is provided in the first inverter 128a connected to the first switch SW1.

Meanwhile, the clock signal CLK may be output as the complementary clock signal CLKb through an inverter by adding the inverter to the first switch SW1 such that the first switch SW1 can be controlled by the complementary clock signal CLKb.

The high-level start pulse signal SP input into the first inverter 128a is changed into the low-level start pulse signal SP. Then, the low-level start pulse signal SP is input to input terminals of the second inverter 128b and the fourth inverter 128d. The low-level start pulse signal SP input to the input terminal of the second inverter 128 is changed into the high-level start pulse signal SP. The high-level start pulse signal SP is input into an input terminal of the third inverter 128c.

Meanwhile, the low-level start pulse signal SP input to the input terminal of the fourth inverter 128d is changed into the high-level start pulse signal SP, and the high-level start pulse signal SP is input to an input terminal of the first inverter 128a. An output terminal of the first inverter 128a is electrically connected to the input terminal of the fourth inverter 128d, and an output terminal of the fourth inverter 128d is electrically connected to the input terminal of the first inverter 128a. The first and fourth inverters 128a and 128d serve as a closed loop capable of temporarily storing the start pulse signal SP provided through the first switch SW1.

The high-level start pulse signal SP input to the input terminal of the third inverter 128c is finally output as the low-level first sampling control signal A.

The first sampling control signal A is provided in the first sampling unit 124-1 and the second control stage 120-2 which is the next stage of the first control stage 120-1.

First, details will be described below relative to the case in which the first sampling control signal A is provided in the first sampling unit 124-1. The first sampling unit 124-1 includes a NOR gate 130 and the first and second inverters 132a and 132b.

The first sampling control signal A is provided to the NOR gate 130 of the first sampling unit 124-1. At this same time, the clock signal CLK is input from an exterior to the input terminal of the NOR gate 130. The first sampling unit 124-1 outputs the first sampling signal Q1 through the logical operation of the NOR gate 130, and the first and second inverters 132a and 132b. The first sampling unit 124-1 outputs the first sampling signal Q1 having the same period as that of the low pulse of the complementary clock signal CLKb in response to the low pulse of the complementary clock signal CLKb during a low level of the first sampling control signal A.

The first sampling signal Q1 output from the first sampling unit 124-1 is provided in the first storing stage 126-1 shown in FIG. 2. Upon receiving the first sampling signal Q1, the first storing stage 126-1 outputs data previously stored.

The second control stage 120-2 includes the second latch unit 122-2 and the second sampling unit 124-2 as described above.

The second latch unit 122-2 includes a second switch SW2 and first to fourth inverters 134a to 134d, and the second sampling unit 124-2 includes a NAND gate 136 and first and second inverters 138a and 138b. The first sampling control signal A is provided in the second latch unit 122-2 of the second control stage 120-2. In detail, the first sampling control signal A is provided to the second switch SW2. In this case, the second switch SW2 is controlled by the clock signal CLK provided in the second latch unit 122-2. In other words, upon receiving the clock signal CLK, the second switch SW2 supplies the first sampling control signal A to an input terminal of the first inverter 134a.

The level of the first sampling control signal A, which is supplied to the first inverter 134a, is changed into a high level, and the high-level first sampling control signal A is input to an input terminal of the second inverter 134b and an input terminal of the fourth inverter 134d.

The high-level first sampling control signal A, which is input to the input terminal of the second inverter 134b, is changed into the low-level first sampling control signal A. Then, the low-level first sampling control signal A is input to an input terminal of the third inverter 134c.

Meanwhile, the high-level first sampling control signal A input to the input terminal of the fourth inverter 134d is changed into the low-level first sampling control signal A, and then the low-level first sampling control signal A is input to the input terminal of the first inverter 134a.

An output terminal of the first inverter 134a is electrically connected to the input terminal of the fourth inverter 134d, and an output terminal of the fourth inverter 134d is electrically connected to an input terminal of the first inverter 134a. The first and fourth inverters 134a and 134d serve as a closed loop capable of temporarily storing the first sampling control signal A provided through the second switch SW2.

The low-level first sampling control signal A input to the input terminal of the third inverter 134c is changed into the high-level first sampling control signal A, and the high-level first sampling control signal A is output as the high-level second sampling control signal B through the third inverter 134c.

The high-level second sampling control signal B is provided in the second sampling unit 124-2. The second sampling unit 124-2 includes a NAND gate 136 and first to third inverters 138a to 138c.

The second sampling unit 124-2 outputs the second sampling signal Q2 through logical operation of the NAND gate 136 and the first to third inverters 138a to 138c. The second sampling unit 124-2 outputs the second sampling signal Q2 having the same period as that of the high pulse of the clock signal CLK in response to the high pulse of the clock signal CLK for the high level of the second sampling control signal B.

The shift register according to the present invention includes an odd control stage, which performs a sampling operation with respect the start pulse signal SP provided from an exterior in response to the clock signal CLK having a low frequency, and an even control stage, which performs a sampling operation with respect to a sampling signal subject to the sampling operation in the odd control stage in response to the clock signal CLK. Accordingly, the shift register can latch data provided from an exterior even at a low frequency.

Figure 4B:
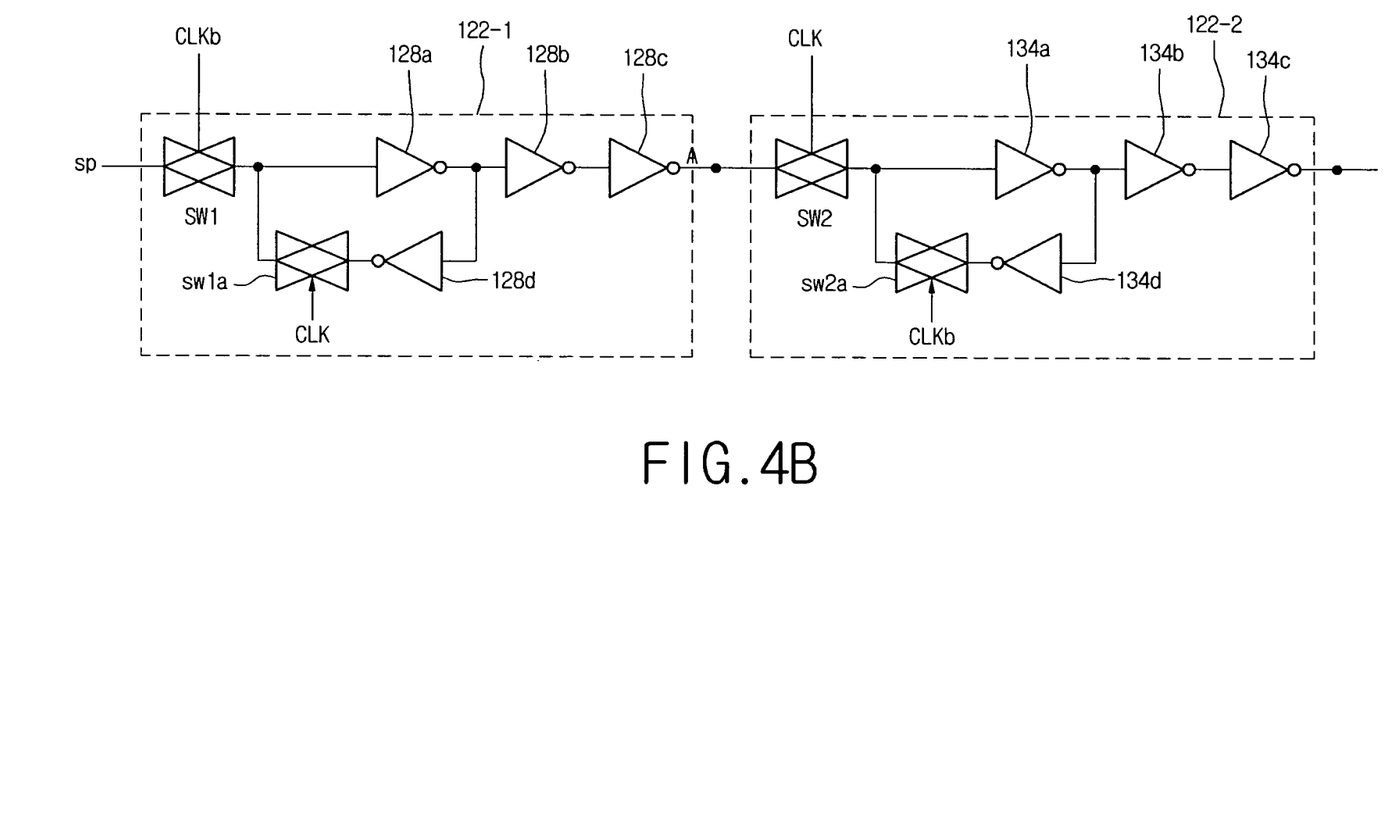
FIG. 4B is a logic circuit diagram showing first and second latch units of FIG. 2 according to another embodiment of the present invention.

Meanwhile, as shown in FIG. 4B, the first and second latch units 122-1 and 122-2 further include switches SW1a and SW2a, respectively.

The first switch SW1 of the first latch unit 122-1 may be controlled by the complementary clock signal CLKb, and the first additional switch SW1a may be controlled by the clock signal CLK. The second switch SW2 of the second latch unit 122-2 may be controlled by the clock signal CLK, and the second additional switch SW2a may be controlled by the complementary clock signal CLKb.

In this case, the first additional switch SW1a is connected between the output terminal of the fourth inverter 128d of the first latch unit 122-1 and the first switch SW1. The second additional switch SW2A is connected between the output terminal of the fourth inverter 134d of the second latch unit 122-2 and the second switch SW2.

The start pulse signal SP is provided to the first switch SW1, the first switch SW1 is controlled by the complementary clock signal CLKb, and the first additional switch SW1a is controlled by the clock signal CLK. Accordingly, since the first switch SW1 is turned on due to a high pulse of the complementary clock signal CLKb, and the clock signal CLK becomes a low pulse, the first additional switch SW1a is turned off.

Since the first switch SW1 is turned on, the start pulse signal SP is provided in the first to third inverters 128a to 128c through the first switch SW1. In this case, the fourth inverter 128d is connected to the output terminal of the first inverter 128a, and the start pulse signal SP is input even in the fourth inverter 128d. At this time, the start pulse signal SP output from the fourth inverter 128d becomes in a high state.

Since the fourth inverter 128d is connected to the first additional switch SW1a as described above, the high pulse output from the fourth inverter 128d is provided to the first additional switch SW1a. In this case, since the first additional switch SW1a is turned off, the start pulse signal SP, which is the high pulse, provided to the first additional switch SW1a is not output.

The start pulse signal SP provided in the first inverter 128a is output as a low pulse, and then output as the low-level first sampling control signal A through the second and third inverters 128b and 128c.

Subsequently, the complementary clock signal CLKb and the clock signal CLK become a low pulse and a high pulse, respectively. At this time, the first switch SW1 is turned off, and the first additional switch SW1a is turned on.

As the first additional switch SW1a is turned on, the high-level start pulse signal SP, which has been input to the first additional switch SW1a, but not output, is provided to the first inverter 128a. The high pulse provided to the first inverter 128a is output as a first low pulse, and then the first low pulse is output as a low pulse through the second and third inverters 128b and 128c.

Consequently, when the complementary clock signal CLKb is a high pulse, and the clock signal CLK is a low pulse, and when the complementary clock signal CLKb is a low pulse, and the clock signal CLK is a high pulse, the first latch unit 122-1 outputs the low-level first sampling control signal A. The second latch unit 122-2 outputs the second sampling control signal B by using the first sampling control signal A output from the first latch unit 122-1.

The first and second additional switches SW1a and SW2a are further provided, so that the first and second sampling control signals A and B are output while overlapping with each other for a predetermined period without delaying the clock signal CLK and the complementary clock signal CLKb for a half period.

Figure 5:
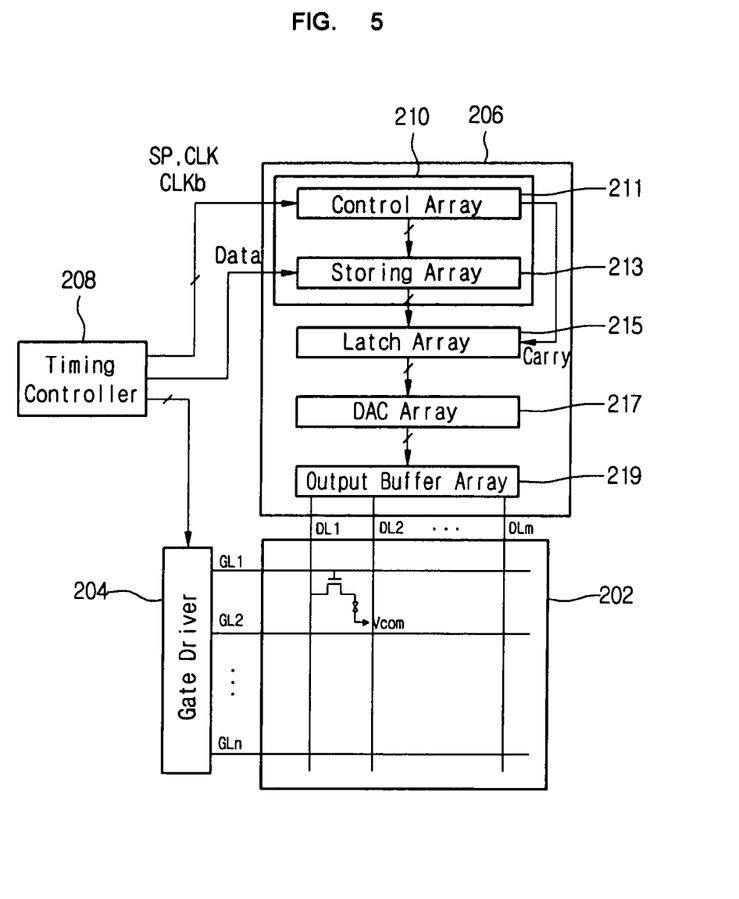
FIG. 5 is a block diagram showing a liquid crystal display device including a shift register according to the present invention.

FIG. 5 is a block diagram showing the liquid crystal display device including the shift register according to the present invention.

As shown in FIG. 5, the liquid crystal display device includes a liquid crystal panel 202 for displaying an image, a gate driver 204 and a data driver 206 for driving the liquid crystal panel 202, and the timing controller 208 for controlling the gate driver 204 and the data driver 206.

A plurality of gate lines GL1 to GLn and a plurality of data lines DL1 to DLm, which define pixel areas, are arranged in the liquid crystal panel 202, and thin film transistors TFTs and pixel electrodes electrically connected to the TFTs are provided in crossing-sections between the gate lines and the data lines.

The timing controller 108 generates gate and data control signals to control the gate and data drivers 204 and 206 suitable for the model of the liquid panel 202 by using vertical/horizontal synchronization signals Vsync/Hsync, a data enable signal DE, and a predetermined clock signal input from a system (not shown).

The gate driver 204 supplies gate scan signals, which are gate high voltage VGH and gate low voltage VGL, to the gate lines GL1 to GLn according to the gate control signal generated from the timing controller 208.

The data driver 206 supplies data voltage to the data lines DL1 to DLm according to the data control signal generated from the timing controller 208.

Hereinafter, the data driver 206 will be described in detail.

The data driver 206 includes a shift register 210, a latch array 215 for simultaneously latching data input from the shift register 210 by a carry signal output from the shift register 210, a DAC array 217 for converting the data latched by the latch array 215 into data voltage (analogue voltage), and an output buffer array 219 for outputting the data voltage converted by the DAC array 217 to the data lines DL1 to DLm.

Since the shift register 210 is identical to the shift register 110 shown in FIG. 2, details will be omitted regarding the shift register 210 in order to avoid redundancy.

The shift register 210 includes a control array 211 for latching a start pulse signal SP received from an exterior to output sampling signals and a storing array 213 for latching data to the latch array 215 by using the sampling signals.

The control array 211 includes a plurality of latch units for outputting sampling control signals by using the start pulse signal SP received from an exterior and a plurality of sampling units for outputting the sampling signals in response to a clock signal CLK by using the sampling control signals output from the latch units.

The latch unit and the sampling unit respond to the clock signal CLK with a low frequency and a complementary clock signal CLKb delayed by a half period with respect to the clock signal CLK and output the sampling control signal and the sampling signal, respectively. The clock signal CLK has a frequency lower than that of an existing clock signal used for an existing shift register.

First sampling control signals output from odd latch units among the latch units and the second sampling control signals output from even latch units are output while overlapping with each other for a predetermined period. In addition, the odd latch units and the even latch units constitute one flip-flop.

Since the shift register 210 is enabled by the clock signal having a frequency lower than that of a clock signal used for an existing shift register, and two sampling signals are output from one flip-flop, the size of the shift register 210 can be reduced. In addition, since the shift register 210 is driven by the clock signal CLK having a low frequency, power consumption can be reduced.

The control array 211 includes a plurality of control stages as described above, and the control stages output sampling signals used to control the storing array 213. A sampling control signal output from the last control stage of the control stages is provided in the latch array 215 as the carry signal.

Upon receiving the carry signal, the latch array 215 simultaneously latch data, which have been sequentially latched from the storing array 213, to the DAC array 217.

The data latched to the DAC array 218 are converted into data voltage (analog voltage) and input to the output buffer array 219. The output buffer array 219 applies the data voltage to the data lines DL1 to DLm arranged on the liquid crystal panel 202.

Since the shift register 210 is driven at a low frequency differently from an existing shift register, power consumption can be reduced. In addition, since the power consumption of the shift register 210 is reduced, the power consumption of the data driver 206 provided in the shift register 210 can be reduced.

As described above, since the shift register according to the present invention is driven at a lower frequency as compared with that of the conventional shift register, power consumption can be reduced.

In addition, since the first and second sampling control signals output from the odd and even control stages are output from one flip-flop, the size of the shift register according to the present invention can be reduced as compared with the size of the conventional shift register.

As described above, since the shift register according to the present invention processes data by using a clock signal having a low frequency, power consumption can be reduced.

In addition, since two sampling control signals are output from one flip-flop, the size of the shift register according to the present invention can be minimized as compared with the size of the conventional shift register.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A shift register, comprising:
    a plurality of odd latch units and a plurality of even latch units connected in series, the plurality of odd latch units each configured to output a first control signal in response to a first clock signal, the plurality of even latch units each configured to output a second control signal in response to a second clock signal, the first clock signal being inverted from the second clock signal and being delayed by a half period with respect to the second clock signal, the first control signal and the second control signal being sequentially and alternately outputted;
    a plurality of odd sampling units and a plurality of even sampling units, the plurality of odd sampling units connected to the respective odd latch units and the plurality of even sampling units connected to the respective even latch units, the plurality of odd sampling units configured to output a first sampling signal in response to the first control signal and a low level of the second clock signal, the plurality of even sampling units configured to output a second sampling signal in response to the second control signal and a high level of the second clock signal, the first sampling signal and the second sampling signal being sequentially and alternately outputted; and
    a plurality of storing cells respectively connected to the sampling units and configured to:
        store data; and
        output the data in response to the first sampling signal or the second sampling signal, the data being sequentially outputted.

2. The shift register of claim 1, wherein:
    each of the latch units comprises:
        a first switch configured to output an input signal as-is, in response to the first clock signal or the second clock signal;
        first to third inverters connected to an output terminal of the first switch in series, the first to third inverters each configured to invert the output signal; and
        a fourth inverter, an input terminal of the fourth inverter being connected to an output terminal of the first inverter, an output terminal of the fourth inverter being connected to an input terminal of the first inverter, such that the output signal is temporarily stored by a closed loop of the first inverter and the fourth inverter, and
    wherein an output terminal of the third inverter of a current latch unit is connected to an input terminal of the first switch of a next latch unit.

3. The shift register of claim 2, wherein each of the latch units further comprises:
    a second switch between the output terminal of the fourth inverter and the input terminal of the first inverter, configured to output an output signal of the fourth inverter as-is, in response to the first clock signal or the second clock signal.

4. The shift register of claim 2, wherein the first switch is complementarily switched with the second switch.

5. The shift register of claim 1, wherein each of the plurality of even sampling units comprises:
    a NOR gate configured to perform a NOR gate operation, based on the first clock signal and the first control signal; and
    at least two or more even-numbered inverters connected in series to the NOR gate.

6. The shift register of claim 1, wherein each of the plurality of even sampling units comprises:
    a NAND gate configured to perform a NAND gate operation, based on the first clock signal and the second control signal; and
    at least one or more odd-numbered inverters connected to the NAND gate.

7. The shift register of claim 1, wherein the first control signal and the second control signal overlap with each other for at least a half period.

8. A data driver, comprising:
    a shift register configured to sequentially output data in response to a first clock signal or a second clock signal, the first clock signal being inverted from the second clock signal and being delayed by a half period with respect to the second clock signal;
    a latch array configured to simultaneously latch data in response to a carry signal from the shift register;
    a digital-to-analog converter configured to convert the data latched in the latch array to an analog voltage; and
    a buffer unit configured to output the analog voltage converted by the digital-to-analog converter,
    wherein the shift register comprises:
        a plurality of odd latch units and a plurality of even latch units connected in series, the plurality of odd latch units each configured to output a first control signal in response to a first clock signal, the plurality of even latch units each configured to output a second control signal in response to a second clock signal, the first clock signal being inverted from the second clock signal and being delayed by a half period with respect to the second clock signal, the first control signal and the second control signal being sequentially and alternately outputted,
        a plurality of odd sampling units and a plurality of even sampling units, the plurality of odd sampling units connected to the respective odd latch units and the plurality of even sampling units connected to the respective even latch units, the plurality of odd sampling units configured to output a first sampling signal in response to the first control signal and a low level of the second clock signal, the plurality of even sampling units configured to output a second sampling signal in response to the second control signal and a high level of the second clock signal, the first sampling signal and the second sampling signal being sequentially and alternately outputted, and
        a plurality of storing cells respectively connected to the sampling units and configured to:
            store data, and
            output the data in response to the first sampling signal or the second sampling signal, the data being sequentially outputted.

9. The data driver of claim 8, wherein the carry signal is the first sampling signal or the second sampling signal outputted from a last sampling unit.

10. A liquid crystal display device, comprising:
    a data driver, comprising:
        a shift register configured to sequentially output data in response to a first clock signal or a second clock signal, the first clock signal being inverted from the second clock signal and being delayed by a half period with respect to the second clock signal, the first control signal and the second control signal having opposite levels;

a latch array configured to simultaneously latch data in response to a carry signal from the shift register;

a digital-to-analog converter configured to convert the data latched in the latch array to an analog voltage; and a buffer unit configured to output the analog voltage converted by the digital-to-analog converter; and a liquid crystal panel configured to display an image corresponding to the data, wherein the shift register comprises:

a plurality of odd latch units and a plurality of even latch units connected in series, the plurality of odd latch units each configured to output a first control signal in response to a first clock signal, the plurality of even latch units each configured to output a second control signal in response to a second clock signal, the first clock signal being inverted from the second clock signal and being delayed by a half period with respect to the second clock signal, the first control signal and the second control signal being sequentially and alternately outputted, a plurality of odd sampling units and a plurality of even sampling units, the plurality of odd sampling units connected to the respective odd latch units and the plurality of even sampling units connected to the respective even latch units, the plurality of odd sampling units configured to output a first sampling signal in response to the first control signal and a low level of the second clock signal, the plurality of even sampling units configured to output a second sampling signal in response to the second control signal and a high level of the second clock signal, the first sampling signal and the second sampling signal being sequentially and alternately outputted, and a plurality of storing cells respectively connected to the sampling units and configured to:

store data, and output the data in response to the first sampling signal or the second sampling signal, the data being sequentially outputted.

* * * * *